(12) United States Patent
Shao

(10) Patent No.: US 10,823,569 B1
(45) Date of Patent: Nov. 3, 2020

(54) MULTIPLE AXIS SENSING DEVICE BASED ON FREQUENCY MODULATION AND METHOD OF OPERATION

(71) Applicant: NXP USA, Inc., Austin, TX (US)

(72) Inventor: Peng Shao, Chandler, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 16/547,687

(22) Filed: Aug. 22, 2019

(51) Int. Cl.
| | |
|---|---|
| G01C 19/5712 | (2012.01) |
| G01C 19/5656 | (2012.01) |
| G01C 19/5649 | (2012.01) |
| H03H 9/24 | (2006.01) |

(52) U.S. Cl.
CPC ..... *G01C 19/5712* (2013.01); *G01C 19/5649* (2013.01); *G01C 19/5656* (2013.01); *H03H 9/2447* (2013.01)

(58) Field of Classification Search
CPC ............ G01C 19/5712; G01C 19/5649; G01C 19/5656; G01C 19/574; G01C 19/5747
See application file for complete search history.

(56) References Cited

U.S. PATENT DOCUMENTS

| | | | | |
|---|---|---|---|---|
| 8,459,110 B2 * | 6/2013 | Cazzaniga | ......... | G01C 19/5747 73/504.12 |
| 8,671,756 B2 | 3/2014 | Comi et al. | | |
| 8,844,357 B2 * | 9/2014 | Scheben | ............ | G01C 19/5747 73/504.12 |
| 9,003,882 B1 * | 4/2015 | Ayazi | ................... | G01C 19/574 73/504.12 |
| 9,651,375 B2 * | 5/2017 | Kuhlmann | ......... | G01C 19/5747 |
| 9,989,364 B2 | 6/2018 | Comi et al. | | |
| 2004/0211258 A1 * | 10/2004 | Geen | .................. | G01C 19/5719 73/510 |
| 2010/0116050 A1 * | 5/2010 | Wolfram | .............. | G01C 19/574 73/504.12 |
| 2010/0281977 A1 * | 11/2010 | Coronato | ........... | G01C 19/5747 73/504.14 |
| 2010/0307241 A1 | 12/2010 | Raman et al. | | |

(Continued)

OTHER PUBLICATIONS

Seshia, Ashwin A. et al; "An Integrated Microelectromechanical Resonant Output Gyroscope"; IEEE International Conference on Micro Electro Mechanical Systems; IEEE Explore; 5 pages (Aug. 7, 2002).

*Primary Examiner* — Helen C Kwok
(74) *Attorney, Agent, or Firm* — Charlene R. Jacobsen

(57) ABSTRACT

A MEMS device includes a first inertial mass system having first drive and sense masses elastically coupled to one another and a second inertial mass system having second drive and sense masses elastically coupled to one another. The first and second drive masses undergo antiphase drive motion along a first axis parallel to the surface of the substrate. First and second sense springs anchor and suspend first and second sense masses spaced apart from the surface of the substrate. The first and second sense springs enable antiphase sense motion of the first and second sense masses along a second axis parallel to the surface in response to an angular rotation about a third axis perpendicular to the surface. The first and second sense springs further enable in-phase sense motion of the first and second sense masses along the second axis in response to a linear acceleration along the second axis.

17 Claims, 6 Drawing Sheets

(56) References Cited

U.S. PATENT DOCUMENTS

| | | | |
|---|---|---|---|
| 2011/0030473 A1* | 2/2011 | Acar | G01P 15/125 |
| | | | 73/504.12 |
| 2012/0060604 A1* | 3/2012 | Neul | G01C 19/5747 |
| | | | 73/504.12 |
| 2012/0210788 A1* | 8/2012 | Gunther | G01C 19/5719 |
| | | | 73/504.12 |
| 2014/0208823 A1 | 7/2014 | Trusov et al. | |
| 2014/0352431 A1* | 12/2014 | Leclerc | G01C 19/5712 |
| | | | 73/504.04 |
| 2015/0211854 A1* | 7/2015 | Ruohio | G01C 19/574 |
| | | | 73/504.12 |
| 2015/0330783 A1* | 11/2015 | Rocchi | G01C 19/5747 |
| | | | 73/504.12 |

* cited by examiner

MULTIPLE AXIS SENSING DEVICE BASED ON FREQUENCY MODULATION AND METHOD OF OPERATION

TECHNICAL FIELD OF THE INVENTION

The present invention relates generally to microelectromechanical systems (MEMS) multiple axis sensing devices. More specifically, the present invention relates to a MEMS multiple axis sensing device based on frequency modulation for concurrently sensing linear acceleration and angular velocity.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensor devices are widely used in applications such as automotive, inertial guidance systems, household appliances, game devices, protection systems for a variety of devices, and many other industrial, scientific, and engineering systems. Ongoing efforts are directed toward the conflicting objectives of reducing the dimensions of MEMS devices while enhancing the sensing capability of such MEMS devices.

SUMMARY

Aspects of the disclosure are defined in the accompanying claims.

In a first aspect, there is provided a microelectromechanical systems (MEMS) multiple axis sensing device comprising a substrate having a surface; a first inertial mass system including a first drive mass and a first sense mass elastically coupled to the first drive mass; a second inertial mass system including a second drive mass and a second sense mass elastically coupled to the second drive mass, the first and second drive masses being configured to undergo antiphase drive motion along a first axis oriented parallel to the surface of the substrate; first sense springs configured to anchor and suspend the first sense mass spaced apart from the surface of the substrate; and second sense springs configured to anchor and suspend the second sense mass spaced apart from the surface of the substrate, the first and second sense springs enabling antiphase sense motion of the first and second sense masses along a second axis parallel to the surface of the substrate and perpendicular to the first axis in response to an angular rotation about a third axis perpendicular to the surface of the substrate, and the first and second sense springs further enabling in-phase sense motion of the first and second sense masses along the second axis in response to a linear acceleration along the second axis.

In a second aspect, there is provided a method comprising providing a microelectromechanical systems (MEMS) multiple axis sensing device including a substrate having a surface, a first inertial mass system including a first drive mass and a first sense mass elastically coupled to the first drive mass, a second inertial mass system including a second drive mass and a second sense mass elastically coupled to the second drive mass, first sense springs configured to anchor and suspend the first sense mass spaced apart from the surface of the substrate, and second sense springs configured to anchor and suspend the second sense mass spaced apart from the surface of the substrate; actuating the first and second drive masses to undergo antiphase drive motion along a first axis oriented parallel to the surface of the substrate; sensing antiphase sense motion of the first and second sense masses along a second axis parallel to the surface of the substrate and perpendicular to the first axis in response to an angular rotation about a third axis perpendicular to the surface of the substrate, wherein the first and second sense springs enable the antiphase sense motion; sensing in-phase sense motion of the first and second sense masses along the second axis in response to a linear acceleration along the second axis, wherein the first and second sense springs further enable the in-phase sense motion; determining an angular rotation rate value of the angular rotation about the third axis in response to the antiphase sense motion; and determining a linear acceleration value of the linear acceleration along the second axis in response to the in-phase sense motion.

In a third aspect, there is provided a microelectromechanical systems (MEMS) multiple axis sensing device comprising a substrate having a surface; a first inertial mass system including a first drive mass and a first sense mass elastically coupled to the first drive mass; a second inertial mass system including a second drive mass and a second sense mass elastically coupled to the second drive mass, the first and second drive masses being configured to undergo antiphase drive motion along a first axis oriented parallel to the surface of the substrate; first sense springs configured to anchor and suspend the first sense mass spaced apart from the surface of the substrate; second sense springs configured to anchor and suspend the second sense mass spaced apart from the surface of the substrate, the first and second sense springs enabling antiphase sense motion of the first and second sense masses along a second axis parallel to the surface of the substrate and perpendicular to the first axis in response to an angular rotation about a third axis perpendicular to the surface of the substrate, and the first and second sense springs further enabling in-phase sense motion of the first and second sense masses along the second axis in response to a linear acceleration along the second axis; a first resonator beam elastically coupled to the first sense mass through one of the first sense springs, the first resonator beam being configured to undergo a first axial stress in response to movement of the first sense mass along the second axis; a second resonator beam elastically coupled to the first sense mass through another one of the first sense springs, the second resonator beam being configured to undergo a second axial stress in response to the movement of the first sense mass along the second axis; a third resonator beam elastically coupled to the second sense mass through one of the second sense springs, the third resonator beam being configured to undergo a third axial stress in response to movement of the second sense mass along the second axis; and a fourth resonator beam elastically coupled to the second sense mass through another one of the second sense springs, the fourth resonator beam being configured to undergo a fourth axial stress in response to the movement of the second sense mass along the second axis, wherein the substrate, the first and second inertial mass systems, the first and second sense springs, and the first, second, third, and fourth resonator beams are collocated in a cavity of a packaged device, the cavity being at vacuum.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a microelectromechanical systems (MEMS) multiple axis sensing device and method of operation. More particularly, the MEMS multiple axis sensing device is based on frequency modulation (FM) for concurrently sensing linear acceleration and angular rate (i.e., velocity) using a single inertial mass detection structure. An FM resonant accelerometer and an FM vibratory gyroscope are co-fabricated as a single detection structure in which detection of the linear acceleration and the angular rate is based on the variation of frequency (e.g., frequency modulation) of one or more elements set in resonance. The linear acceleration can be detected by a common mode FM signal and the angular rate can be detected by a differential mode FM signal. Resonant detection, as compared to other measuring techniques, can yield a direct frequency output, high sensitivity, and wide dynamic range. Further, a single FM-based detection structure enables the same cavity pressure for both accelerometer and gyroscope, which may thereby simplify the MEMS processing technology, reduce MEMS die size, and reduce the quantity of MEMS dies in a sensor package.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figures 1, 2:
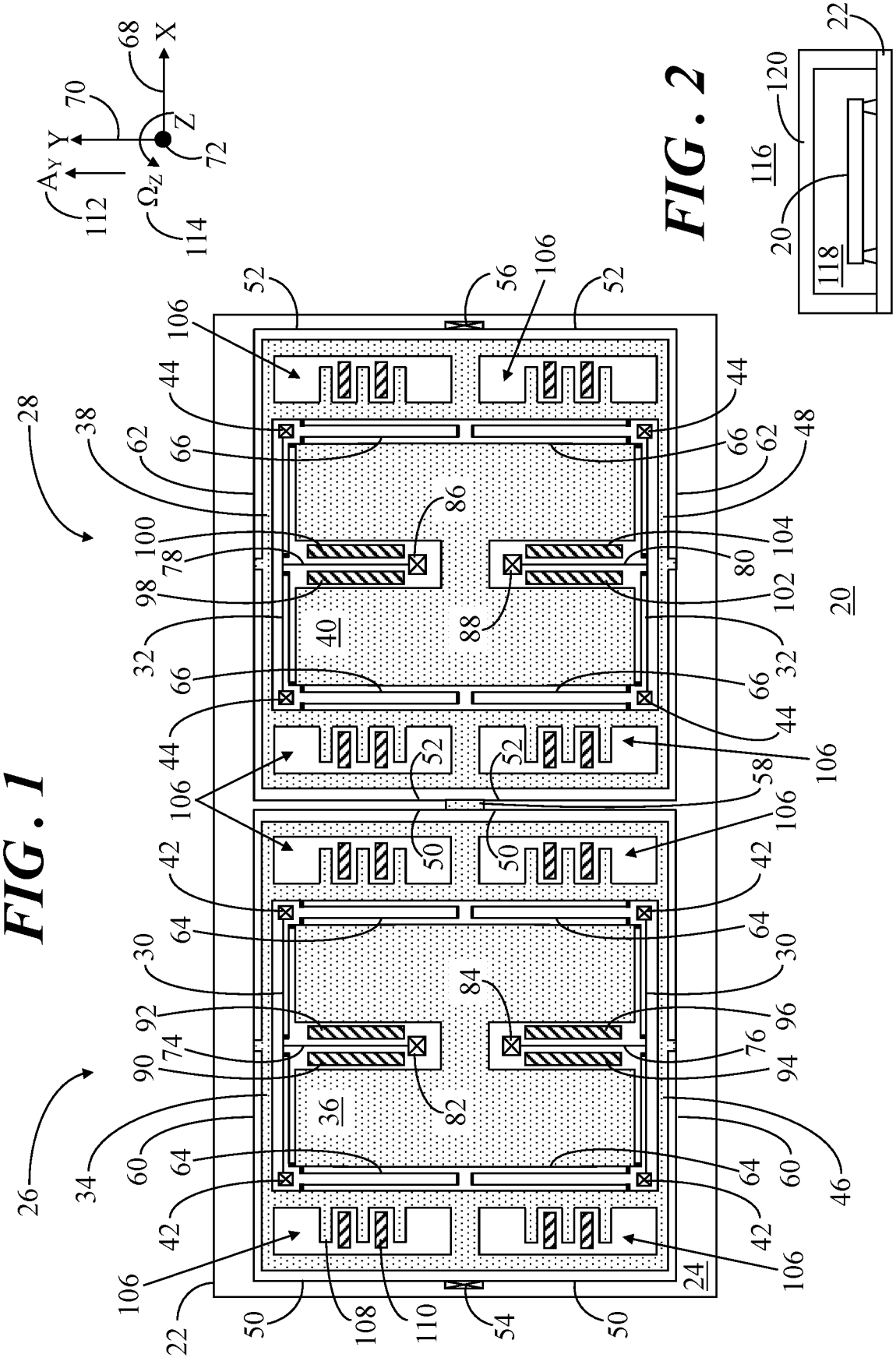
FIG. 1 shows a schematic plan view of a microelectromechanical systems (MEMS) multiple axis sensing device in accordance with an embodiment.
FIG. 2 shows a highly simplified schematic side view of a MEMS sensor package containing the MEMS device of FIG. 1.

Referring to FIG. 1, FIG. 1 shows a schematic plan view of a microelectromechanical systems (MEMS) multiple axis sensing device 20 in accordance with an embodiment. MEMS device 20 includes a substrate 22 having a generally planar surface 24, a first inertial mass system 26, a second inertial mass system 28, first sense springs 30, and second sense springs 32. First inertial mass system 26 includes a first drive mass 34 and a first sense mass 36 elastically coupled to first drive mass 34. Similarly, second inertial mass system 28 includes a second drive mass 38 and a second sense mass 40 elastically coupled to second drive mass 38.

First sense springs 30 are configured to anchor and suspend first sense mass 36 spaced apart from surface 24 of substrate 22 and second sense springs 32 are configured to anchor and suspend second sense mass 40 spaced apart from surface 24 of substrate 22. Hence, first sense springs 30 are interconnected between first sense mass 36 and anchors 42 fixed to surface 24 and second sense springs 32 are interconnected between second sense mass 40 and anchors 44 fixed to surface 24.

First drive mass 34 includes a first frame 46 surrounding first sense mass 36 and second drive mass 38 includes a second frame 48 surrounding second sense mass 40. First drive springs 50 are configured to anchor and suspend first frame 46 spaced apart from surface 24 of substrate 22 and second drive springs 52 are configured to anchor and suspend second frame 48 spaced apart from surface 24 of substrate 22. Hence, first drive springs 50 are interconnected between first frame 46 and an anchor 54 fixed to surface 24 and second drive springs 52 are interconnected between second frame 48 and an anchor 56 fixed to surface 24. First and second drive springs 50, 52 are interconnected at a junction element 58 spaced apart from surface 24 of substrate 22 such that first and second drive springs 50, 52 flexibly interconnect first and second drive masses 34, 38.

Third sense springs 60 are coupled to the outer perimeter of first frame 46 and to first drive springs 50. Likewise, fourth sense springs 62 are coupled to the outer perimeter of second frame 48 and to second drive springs 52. Additionally, third drive springs 64 are interposed between and interconnect first sense mass 36 and first frame 46 of first drive mass 34. Fourth drive springs 66 are interposed between and interconnect second sense mass 40 and second frame 48 of second drive mass 38. Third and fourth drive springs 64, 66 may be any convenient shape, size, and material In general, first, second, third, and fourth sense springs 30, 32, 60, 62 have a longitudinal extension (e.g., a lengthwise flexible dimension) that is parallel to an X-axis 68 in a three-dimensional coordinate system. First, second, third, and fourth drive springs 50, 52, 64, 66 have a longitudinal extension (e.g., a lengthwise flexible dimension) that is parallel to a Y-axis 70 in the three-dimensional coordinate system. In this example, X-axis 68 and Y-axis 70 are parallel to surface 24 of substrate 22 and are perpendicular to one another. The three-dimensional coordinate system additionally includes a Z-axis 72 that is perpendicular to surface 24 of substrate 22, and is thus perpendicular to X- and Y-axes 68, 70. First, second, third, and fourth drive springs 50, 52, 64, 66 may be any convenient shape, size, and material that to allow a large oscillatory linear motion of first and second drive masses 34, 38 along X-axis 68 (e.g., the drive axis) while preventing transmission of this oscillatory linear motion to first and second sense masses 36, 40, and are yet rigid enough to transfer the Coriolis force from first and second drive masses 34, 38 to first and second sense masses 36, 40 along Y-axis 70 (e.g., the sense axis) in response to rotation of MEMS device 20 about Z-axis 72 (e.g., the input axis).

MEMS multiple axis sensing device 20 further includes a first, second, third, and fourth resonator beams 74, 76, 78, 80. First resonator beam 74 has one end elastically coupled to first sense mass 36 through one of first sense springs 30 and its opposing end fixed to surface 24 of substrate 22 via an anchor 82. Second resonator beam 76 has one end elastically coupled to first sense mass 36 through another one of first springs 30 and its opposing end fixed to surface 24 via an anchor 84. Third resonator beam 78 has one end elastically coupled to second sense mass 40 through one of second sense springs 32 and its opposing end fixed to surface 24 via an anchor 86. Fourth resonator beam 80 has one end elastically coupled to second sense mass 40 through another one of second sense springs 32 and its opposing end fixed to surface 24 via an anchor 88.

A first drive electrode 90 and a first sense electrode 92 are aligned with first resonator beam 74. A second drive electrode 94 and a second sense electrode 96 are aligned with second resonator beam 76. A third drive electrode 98 and a third sense electrode 100 are aligned with third resonator beam 78. A fourth drive electrode 102 and a fourth sense electrode 104 are aligned with fourth resonator beam 80.

In general, each of first, second, third, and fourth drive electrodes 90, 94, 98, 102 is used to send its associated one of first, second, third, and fourth resonator beam 74, 76, 78, 80 into a resonance condition by applying an appropriate difference of electrical potential. Each of first, second, third, and fourth sense electrodes 92, 96, 100, 104 is used as a detection electrode, for detecting, variations of the corresponding resonance frequency by means of a variation of the capacitive coupling with its associated one of first, second, third, and fourth resonator beam 74, 76, 78, 80. As will be discussed in connection with FIG. 6, suitable electrical connections may be provided for the electrical connection of drive electrodes 90, 94, 98, 102 and sense electrodes 92, 96, 100, 104 to an electronic circuit. The electronic circuit is configured to supply the electrical signals of actuation to first, second, third, and fourth drive electrodes 90, 94, 98, 102 and to receive and process the electrical detection signals provided by first, second, third, and fourth sense electrodes 92, 96, 100, 104.

For consistency throughout the description of the following figures, any anchoring structures, such as anchors 42, 44, 54, 56 82, 84, 86, 88, that connect a suspended element of MEMS device 20 to the underlying surface 24 of substrate 22 are illustrated with an "X" through it. Elements that are suspended above surface 24 of substrate 22 are represented by a stippled pattern. Spring elements suspended above surface 24 are generally represented by solid lines. Elements that are directly fixed to surface 24 of substrate 22, but do not connect an element of MEMS device 20 to the underlying surface 24, are illustrated with upward and rightward wide hatching or, alternatively, with downward and rightward wide hatching.

A drive actuation and measurement unit, referred to herein as a drive system 106, resides in openings of each of first and second drive masses 34, 38 and operably communicates with first and second drive masses 34, 38. More specifically, drive system 106 includes drive elements configured to linearly oscillate first drive mass 34 and drive elements configured to linearly oscillate second drive mass 38. Each of the drive elements includes electrodes, referred to as movable and fixed fingers 108, 110, that are spaced apart from one another and positioned in alternating arrangement. Only a few movable and fixed fingers 108, 110 are shown for clarity of illustration. Those skilled in the art should readily recognize that the quantity and structure of the movable and fixed fingers will vary in accordance with design requirements.

First and second drive masses 34, 38 are configured to undergo oscillatory motion within a plane parallel to surface 24 of substrate 22. For example, an alternating current (AC) voltage may be applied to fixed fingers 110 via a drive circuit (not shown) to cause movable fingers 108 (and thus first and second drive masses 34, 38) to move generally parallel to fixed fingers 110. The linkage of first and second drive masses 34, 38 via first and second drive springs 50, 52 and junction element 58 enables drive motion of first and second drive masses 34, 38 in opposite directions (i.e., phase opposition) along a first axis oriented parallel to surface 24 of substrate 22 (e.g., X-axis 68 in this configuration). This drive motion in phase opposition is referred to herein as antiphase drive motion. However, third and fourth drive springs 64, 66 interconnecting the first and second sense masses 36, 40 with the associated first and second frames 46, 48 of first and second drive masses 34, 38 suitably deform to largely prevent transmission of the antiphase drive motion from first and second drive masses 34, 38 to first and second sense masses 36, 40. Said another way, first and second sense masses 36, 40 are generally non-movable along X-axis 68 relative to first and second drive masses 34, 38.

First and second sense springs 30, 32 are configured to enable in-phase sense motion of first and second sense masses 36, 40 along a second axis parallel to surface 24 of substrate 22 and perpendicular to the first axis in response to a linear acceleration along the second axis. Additionally, first and second sense springs 30, 32 are configured to enable antiphase sense motion of first and second sense masses 36, 40 along the second axis in response to an angular rotation about a third axis perpendicular to surface 24 of substrate 22. Similarly, third and fourth sense springs 60, 62 are configured to enable the movement of first and second drive masses 34, 38 jointly with first and second sense masses 36, 40.

In this example, the first axis is X-axis 68, the second axis is Y-axis 70, and the third axis is Z-axis 72 in the defined three-dimensional coordinate system. Hence, the linear acceleration is a Y-axis linear acceleration 112, $A_Y$, and the angular rotation is a Z-axis angular rotation 114, $\Omega Z$. Thus, Y-axis linear acceleration 112 will cause both of first and second sense masses 36, 40 to move together along the Y-axis 70, referred to as common mode. A Coriolis force due to Z-axis angular rotation 114 will cause first and second sense masses 36, 40 to move in opposing directions, referred to as differential mode. Of course, it should be understood that the sense and drive masses may be rotated 90° in a plane parallel to surface 24 of substrate 22 to suitably detect an X-axis linear acceleration in lieu of Y-axis linear acceleration 112. Further, a configuration will be discussed in connection with FIG. 7 for detecting both X-axis and Y-axis linear acceleration.

First, second, third, and fourth resonator beams 74, 76, 78, 80 will undergo either tension or compression, referred to as axial stress, in response to the movement of first and second sense masses 36, 40. Thus, first resonator beam 74 is configured to undergo a first axial stress in response to movement of first sense mass 36 along Y-axis 70 and second resonator beam 76 is configured to undergo a second axial stress in response to the movement of first sense mass 36 along Y-axis 70. Third resonator beam 78 is configured to undergo a third axial stress in response to movement of second sense mass 40 along Y-axis 70 and fourth resonator beam 80 is configured to undergo a fourth axial stress in response to the movement of second sense mass 40 along Y-axis 70. The respective axial stresses will result in a frequency shift of the resonance frequency of resonator beams 74, 76, 78, 80, which can be suitably processed at an electronic circuit (e.g., a signal processing circuit, FIG. 6) to obtain a common mode signal representing Y-axis linear acceleration 112 and to obtain a differential mode signal representing Z-axis angular rotation 114.

Referring to jointly FIGS. 1 and 2, FIG. 2 shows a highly simplified schematic side view of a MEMS sensor package 116 containing MEMS multiple axis device 20. MEMS sensor package 116 includes the MEMS multiple axis device 20 (represented by a block for simplicity of illustration) residing in a single cavity 118 formed between substrate 22 and an enclosure 120. Thus, first and second inertial mass systems 26, 28, the various sense springs 30, 32, 60, 62, and the various drive springs 50, 52, 64, 66 are collocated in cavity 118 of MEMS sensor package 116. In some embodiments, cavity 118 may be at vacuum.

Many prior art MEMS gyroscope and accelerometers rely on amplitude modulation (AM) of the input stimulus, wherein the inertial input produces a proportional change in the sensor output voltage. In other words, the inertial input is amplitude modulated such that the final output signal of the sensor is proportional to the true input, as well as a number of device parameters (e.g., stiffness of the springs, pick-up electronics gain, and so forth).

In a number of applications, it may be desirable to create a multiple axis sensing device on a single die. However, creating conventional gyroscopes and accelerometers on a single die has significant drawbacks. In particular, creating conventional gyroscopes and accelerometers requires very different packaging parameters. A MEMS gyroscope chip is typically packaged at a specific vacuum level to get a desired quality factor (Q-factor). The Q-factor is a dimensionless parameter that describes how underdamped an oscillator is and therefore characterizes the oscillator's bandwidth relative to its center frequency. A higher Q-factor indicates a lower rate of energy loss relative to the stored energy of the oscillator (that is, the oscillations die out more slowly). Thus, a MEMS gyroscope typically has a high Q-factor, thus low damping, so that it rings or vibrates longer. Conversely, a conventional AM-based accelerometer must have a very low Q-factor. That is, the conventional AM-based accelerometer must be damped to provide bandwidth, which requires it to be encapsulated at or above atmospheric or above atmospheric pressure to provide the necessary bandwidth.

A high precision gyroscope requires vacuum cavities for operation, and at the same time, AM-based accelerometers operate at atmospheric or above atmospheric pressure to provide the necessary bandwidth. The fundamental difference between packaging of prior art MEMS gyroscopes and accelerometers makes co-fabrication and co-packaging unfeasible. In accordance with embodiments described herein, a single detection structure that combines a resonance accelerometer (e.g., an FM accelerometer) and an FM gyroscope, can allow the footprint of the system as a whole to be reduced relative to configurations that implement multiple single axis sensors since the single structure can be housed in a single cavity (e.g., cavity 118 of MEMS sensor package 116). Accordingly, the single detection structure configuration may yield a significantly reduced silicon die size and simplified process technology with a commensurate reduction in cost and simplified assembly process.

Figure 3:
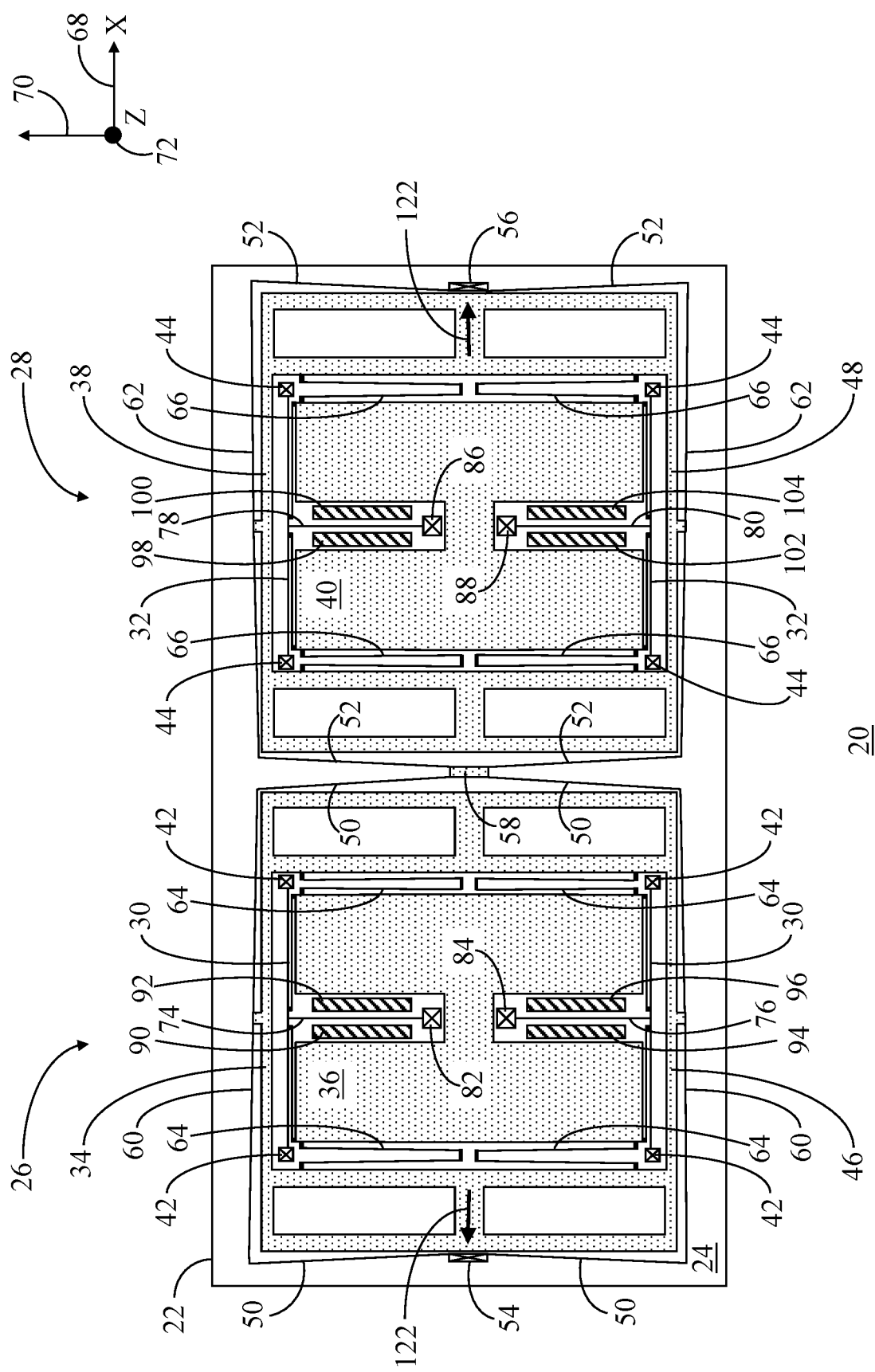
FIG. 3 shows a schematic plan view of the MEMS device of FIG. 1 demonstrating antiphase drive motion.

FIG. 3 shows a simplified schematic plan view of MEMS multiple axis sensing device 20 demonstrating antiphase drive motion 122, represented by oppositely directed arrows. In this simplified schematic plan view, drive system 106 with movable and fixed fingers 108, 110 is not shown for simplicity. However, reference may be made to FIG. 1 which shows drive system 106 with movable and fixed fingers 108, 110. In general, AC voltage may be applied to fixed fingers 110 via a drive circuit (not shown) to cause movable fingers 108, and thus first and second drive masses 34, 38, to move generally parallel to fixed fingers 110.

The linkage of first and second drive masses 34, 38 via first and second drive springs 50, 52 and junction element 58 enables drive motion of first and second drive masses 34, 38 in opposite directions, i.e., phase opposition, along the drive axis, e.g., which in this example is X-axis 68. This drive motion is referred to as antiphase drive motion 122. Antiphase drive motion 122 of first and second drive masses 34, 38 may be kept constant to maintain a constant sensitivity of MEMS multiple axis sensing device 20. Additionally or alternatively, the frequency of oscillation can be locked to the mechanical resonance of first and second inertial masses 26, 28 to minimize drive power.

Third drive springs 64 interconnecting first sense mass 36 with first frame 46 of first drive mass 34 and fourth drive springs 66 interconnecting second sense mass 40 with second frame 48 of second drive mass 38 suitably flex or deform to largely prevent the transmission of antiphase drive motion 122 from first and second drive masses 34, 38 to first and second sense masses 36, 40. Thus, first, second, third, and fourth resonator beams 74, 76, 78, 80 will not be subjected to stress due to antiphase drive motion 122, and will thus not provide output signals having a signal error component that is a function of antiphase drive motion 122.

Figure 4:
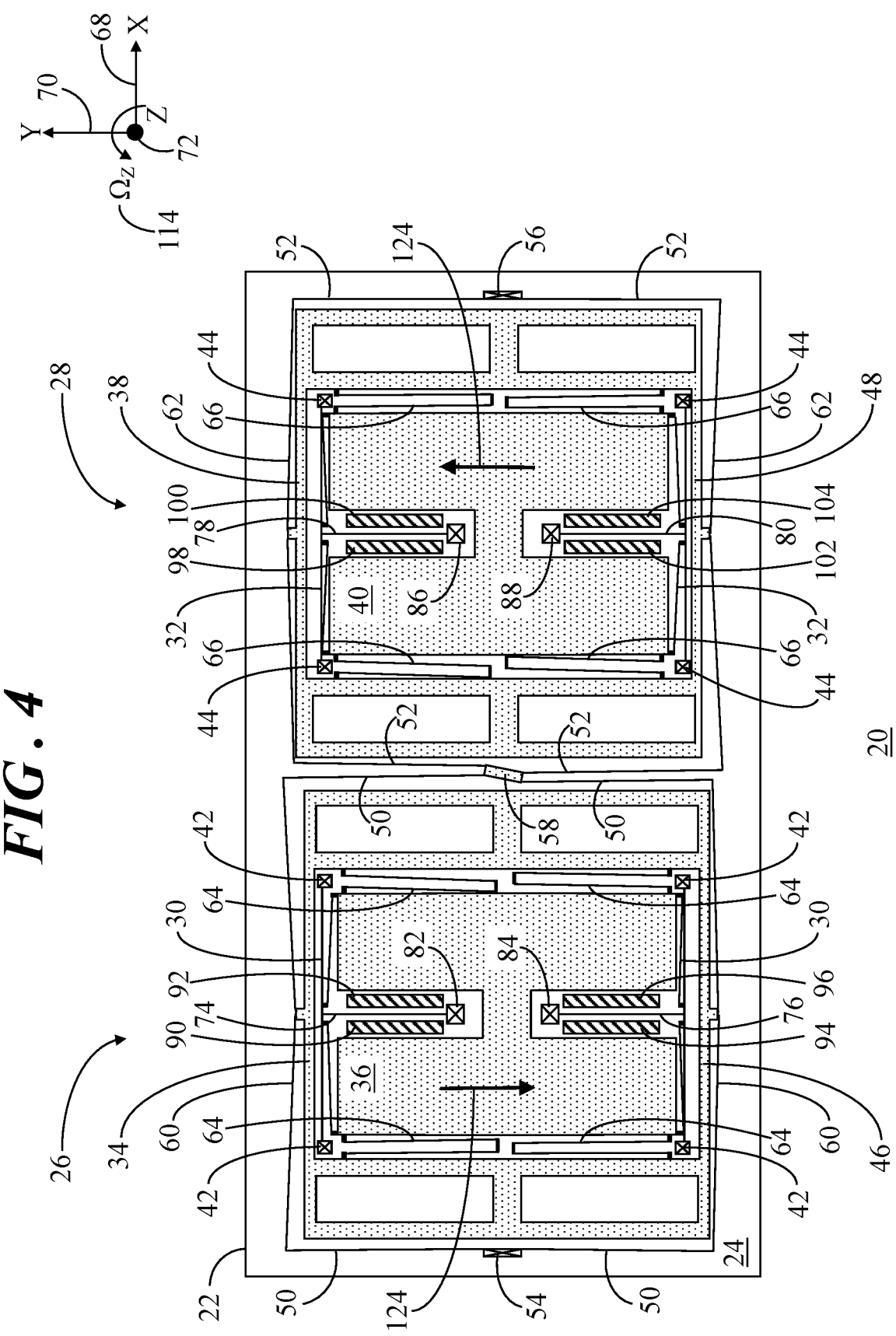
FIG. 4 shows a schematic plan view of the MEMS device of FIG. 1 demonstrating antiphase sense motion.

FIG. 4 shows a simplified schematic plan view of MEMS multiple axis sensing device 20 demonstrating antiphase sense motion 124, represented by oppositely directed arrows. Again, in this simplified schematic plan view, drive system 106 with movable and fixed fingers 108, 110 is not shown for simplicity. Once first and second drive masses 34, 38 are put into antiphase drive motion 122 parallel to the drive axis (e.g., X-axis 68) and first, second, third, and fourth resonator beams 74, 76, 78, 80 are actuated to resonate at a resonance frequency, first and second inertial mass systems 26, 28 are capable of detecting an angular rate (e.g., Z-axis angular rotation 114) induced by MEMS device 20 being rotated about an axis of rotation, typically referred to as an input axis (e.g., Z-axis 72). As MEMS device 20 experiences Z-axis angular rotation 114 about Z-axis 72, first and second inertial mass systems 26, 28 undergo oscillatory sense motion in opposite directions, i.e., phase opposition, along the sense axis (e.g., Y-axis 70). This sense motion is referred to as antiphase sense motion 124.

In particular, a Coriolis force occurs relative to Y-axis 70, which is perpendicular to X-axis 68 and Z-axis 72. The Coriolis force causes generally in-plane linear antiphase sense motion 124 of inertial mass systems 26, 28. This antiphase sense motion 124 has an amplitude that is proportional to Z-axis angular rotation 114 of MEMS device 20 about Z-axis 72. Antiphase sense motion 124 can be detected as variations of the corresponding resonance frequency of first, second, third, and fourth resonator beams 74, 76, 78, 80.

Figure 5:
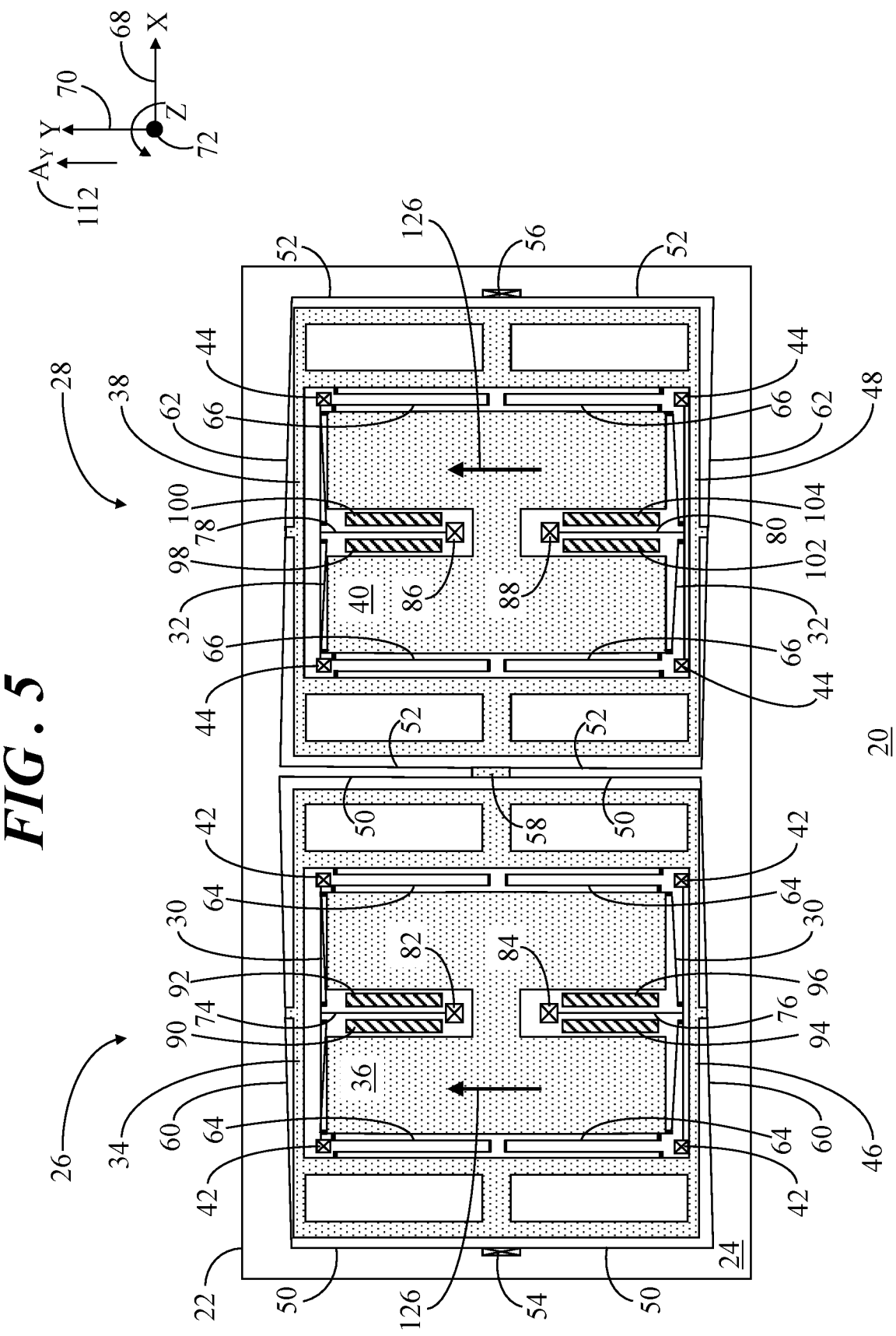
FIG. 5 shows a schematic plan view of the MEMS device of FIG. 1 demonstrating in-phase sense motion.

FIG. 5 shows a simplified schematic plan view of MEMS multiple axis sensing device 20 demonstrating in-phase sense motion 126, represented by arrows pointing in the same direction. Again, in this simplified schematic plan view, drive system 106 with movable and fixed fingers 108, 110 is not shown for simplicity. Once first, second, third, and fourth resonator beams 74, 76, 78, 80 are actuated to resonate at a resonance frequency, first and second inertial mass systems 26, 28 are capable of detecting a linear acceleration (e.g., Y-axis linear acceleration 112) when MEMS device 20 experiences Y-axis linear acceleration 112 along Y-axis 70. As MEMS device 20 experiences Y-axis linear acceleration 112 parallel to Y-axis 70, first and second inertial mass systems 26, 28 undergo sense motion in the same direction along the sense axis (e.g., Y-axis 70). This sense motion is referred to as in-phase sense motion 126. This in-phase sense motion 126 has an amplitude that is proportional to Y-axis linear acceleration 112 of MEMS device 20 along Y-axis 70. In-phase sense motion 126 can be detected as variations of the corresponding resonance frequency of first, second, third, and fourth resonator beams 74, 76, 78, 80.

Figure 6:
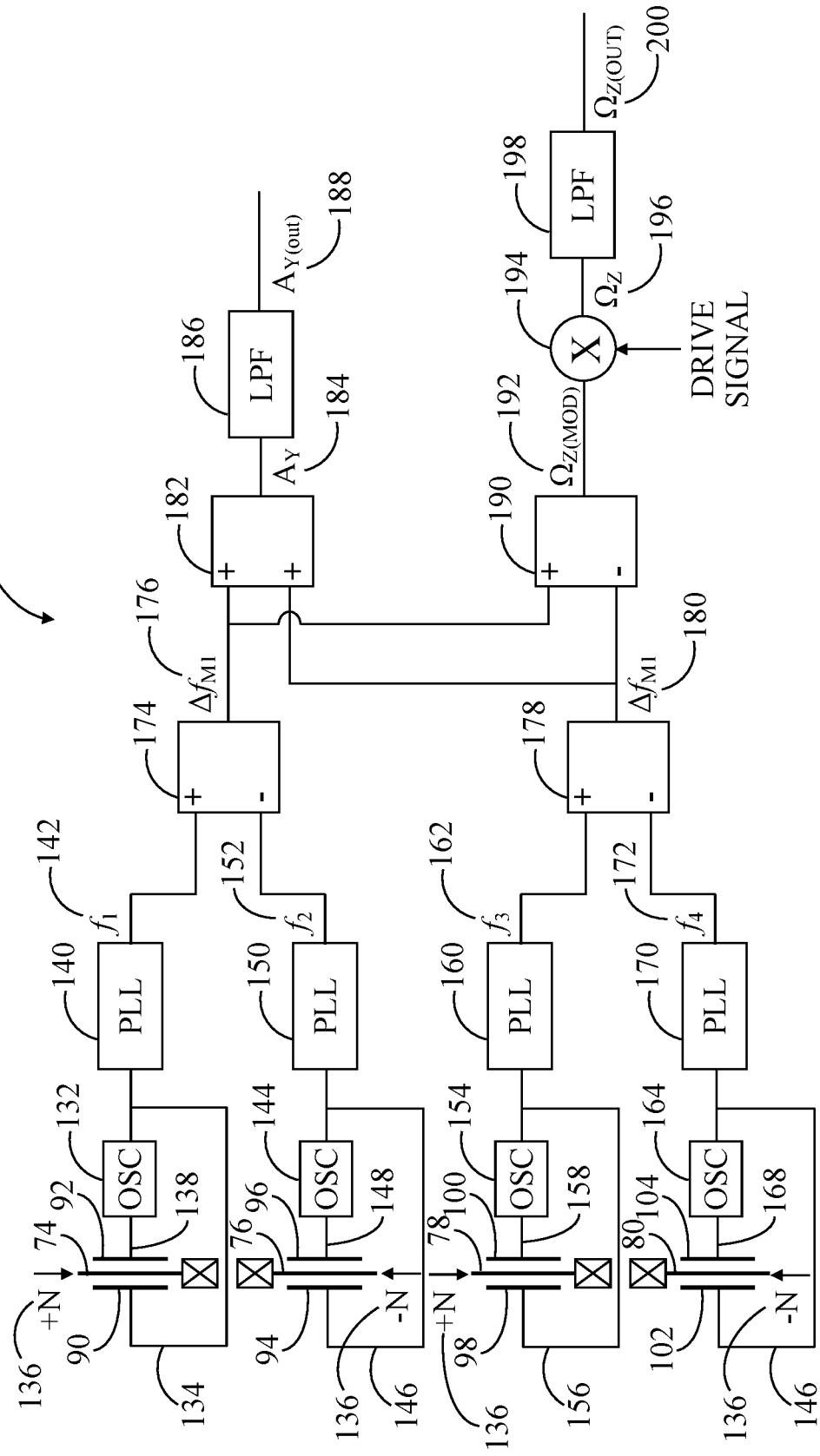
FIG. 6 shows a block diagram of a signal processing circuit of the MEMS device of FIG. 1.

FIG. 6 shows a block diagram of a signal processing circuit 130 of the MEMS multiple axis sensing device 20. In general, signal processing circuit 130 is configured to receive output signals from sense electrodes 92, 96, 100, 104 and generate a linear acceleration value representative of Y-axis linear acceleration 112 and/or an angular rotation rate value representative of Z-axis angular rotation 114.

It will be recalled that first and second resonator beams 74, 76 are elastically coupled to first sense mass 36 (FIG. 1) via respective first sense springs 30 (FIG. 1) and third and fourth resonator beams 78, 80 are elastically coupled to second sense mass 40 (FIG. 1) via respective second sense springs 32. First drive electrode 90 and first sense electrode 92 are aligned with first resonator beam 74. Second drive electrode 94 and second sense electrode 96 are aligned with second resonator beam 76. Third drive electrode 98 and third sense electrode 100 are aligned with third resonator beam 78. Fourth drive electrode 102 and fourth sense electrode 104 are aligned with fourth resonator beam 80.

Each of first drive electrode 90 and first sense electrode 92 are electrically connected with a first oscillator circuit 132. First oscillator circuit 132 is configured to produce a periodic, oscillating electronic signal 134 at, for example, a resonance frequency, that is provided to first drive electrode 90 in order to resonate first resonator beam 74. First resonator beam 74 is configured to undergo a first axial stress (e.g., tension or compression) in response to an inertial force 136 (linear acceleration and/or a Coriolis force) that causes movement of first sense mass 36. First sense electrode 92 is configured to detect variations of the resonance frequency of first resonator beam 74 in response to the first axial stress (e.g., tension or compression) imposed on first resonator beam 74 in response to inertial force 136 and provide a first output signal 138 corresponding to the first axial stress. A first phase-locked loop circuit 140 is configured to receive first output signal 138 and generate a first frequency signal 142, $f_1$, whose phase is related to first output signal 138.

Each of second drive electrode 94 and second sense electrode 96 are electrically connected with a second oscillator circuit 144. Second oscillator circuit 144 is configured to produce a periodic, oscillating electronic signal 146 at, for example, a resonance frequency, that is provided to second drive electrode 94 in order to resonate second resonator beam 76. Second resonator beam 76 is configured to undergo a second axial stress (e.g., tension or compression) in response to inertial force 136 (linear acceleration and/or a Coriolis force) that causes the movement of first sense mass 36. Second sense electrode 96 is configured to detect variations of the resonance frequency of second resonator beam 76 in response to the second axial stress (e.g., tension or compression) imposed on second resonator beam 76 in response to inertial force 136 and provide a second output signal 148 corresponding to the second axial stress. A second phase-locked loop circuit 150 is configured to receive second output signal 148 and generate a second frequency signal 152, $f_1$, whose phase is related to second output signal 148.

Each of third drive electrode 98 and third sense electrode 100 are electrically connected with a third oscillator circuit 154. Third oscillator circuit 154 is configured to produce a periodic, oscillating electronic signal 156 at, for example, a resonance frequency, that is provided to third drive electrode 98 in order to resonate third resonator beam 78. Third resonator beam 78 is configured to undergo a third axial stress (e.g., tension or compression) in response to inertial force 136 (linear acceleration and/or a Coriolis force) that causes the movement of second sense mass 40. Third sense electrode 100 is configured to detect variations of the resonance frequency of third resonator beam 78 in response to the third axial stress (e.g., tension or compression) imposed on third resonator beam 78 in response to inertial force 136 and provide a third output signal 158 corresponding to the third axial stress. A third phase-locked loop circuit 160 is configured to receive third output signal 158 and generate a third frequency signal 162, $f_3$, whose phase is related to third output signal 158.

Each of fourth drive electrode 102 and fourth sense electrode 104 are electrically connected with a fourth oscillator circuit 164. Fourth oscillator circuit 164 is configured to produce a periodic, oscillating electronic signal 166 at, for example, a resonance frequency, that is provided to fourth drive electrode 102 in order to resonate fourth resonator beam 80. Fourth resonator beam 80 is configured to undergo a fourth axial stress (e.g., tension or compression) in response to inertial force 136 (linear acceleration and/or a Coriolis force) that causes the movement of second sense mass 40. Fourth sense electrode 104 is configured to detect variations of the resonance frequency of fourth resonator beam 80 in response to the fourth axial stress (e.g., tension or compression) imposed on fourth resonator beam 80 in response to inertial force 136 and provide a fourth output signal 168 corresponding to the fourth axial stress. A fourth phase-locked loop circuit 170 is configured to receive fourth output signal 168 and generate a fourth frequency signal 172, $f_4$, whose phase is related to fourth output signal 168.

First, second, third, and fourth resonator beams 74, 76, 78, 80 are kept in resonance in the plane along Y-axis 70. In the absence of inertial force 136, first, second, third, and fourth resonator beams 74, 76, 78, 80 have the same nominal flexural oscillation frequency, $f_0$. When inertial force 136 (which may be Y-axis linear acceleration 112 or a Coriolis force corresponding to Z-axis angular rotation 114) is applied, first, second, third, and fourth resonator beams 74, 76, 78, 80 are subject to axial action (e.g., axial stress). In the illustrated configuration, first and second resonator beams 74, 76 will be subject to opposing axial stresses (e.g., one resonator beam will be subject to compressive stress and the other resonator beam will concurrently be subject to tensile stress). Likewise, third and fourth resonator beams 78, 80 will be subject to opposing axial stresses.

The fundamental frequency of a single resonator beam with no axial loading can be characterized as follows:

$$f_0 = \frac{c^2}{2\pi L^2} \sqrt{\frac{EI}{\rho A}} \quad (1)$$

The axial action imposed on first, second, third, and fourth resonator beams 74, 76, 78, 80 due to inertial force 136 (e.g. linear acceleration 112 and/or the Coriolis force related to angular rotation 114) determines a variation of the natural resonance frequency, designated generically as $f_n$, of the resonator beam (e.g., any of first, second, third, and fourth resonator beams 74, 76, 78, 80). The variation of the natural resonance frequency (e.g., the fundamental frequency, $f_0$, can be characterized as follows:

$$f_n = f_0 \sqrt{1 + \alpha \frac{NL^2}{EI}} \quad (2)$$

In expressions (1) and (2), c and a are coefficients based on the resonator beam, L is length of the resonator beam, E is the elastic modulus, I is the moment of inertia, p is the mass density of the material of the resonator beam, A is the area of a cross-section of the resonator beam, and N is the axial action or force. In expression (2), n=1-4. Thus, in this example, $f_n$ corresponds to the variation of the natural resonance frequency for any one of first, second, third, and fourth resonator beams 74, 76, 78, 80 (e.g., $f_1$, $f_2$, $f_3$, $f_4$).

Signal processing circuit 130 includes a first combining circuit 174 (e.g., a differential frequency circuit) in electrical communication with the outputs of first and second phase locked loop circuits 140, 150. First combining circuit 174 provides a first differential output signal 176, $\Delta f_{M1}$, based on the difference between the measured resonance frequencies of first and second resonator beams 74, 76 (e.g., the difference between first and second frequency signals 142, 152). Considering linearization and first and second resonator beams 74, 76 that are subject to first and second axial stresses due to movement of first sense mass 36, the variation of flexural resonance frequency (e.g., first differential output signal 176), which is proportional to inertial force 136 imposed on first sense mass 36, can be characterized as follows:

$$\Delta f_{M1} \cong f_1 - f_2 \cong f_0 \left(1 + \alpha \frac{NL^2}{2EI} - 1 - \alpha \frac{-NL^2}{2EI}\right) = f_0 \alpha \frac{NL^2}{EI} \quad (3)$$

Additionally, signal processing circuit 130 includes a second combining circuit 178 (e.g., a differential frequency circuit) in electrical communication with the outputs of third and fourth phase locked loop circuits 160, 170. Second combining circuit 178 provides a second differential output signal 180, $\Delta f_{M2}$, based on the difference between the measured resonance frequencies of third and fourth resonator beams 74, 76 (e.g., the difference between third and fourth frequency signals 162, 172). Considering linearization and third and fourth resonator beams 78, 80 that are subject to third and fourth axial stresses due to movement of second sense mass 38, the variation of flexural resonance frequency (e.g., second differential output signal 180), which is proportional to inertial force 136 imposed on second sense mass 40, can be characterized as follows:

$$\Delta f_{M2} \cong f_3 - f_4 \cong f_0 \left(1 + \alpha \frac{NL^2}{2EI} - 1 - \alpha \frac{-NL^2}{2EI}\right) = f_0 \alpha \frac{NL^2}{EI} \quad (4)$$

Accordingly, the relative changes of resonance frequencies will manifest themselves as a variation in the combined differential output for each pair of resonator beams associated with a particular sense mass (e.g., $\Delta f_{M1}$ and $\Delta f_{M2}$). Generally speaking, the relation between axial action and the change in resonance frequencies may be expressed in Hz/G (where G is G force) for linear acceleration and Hz/dps for angular rotation rate (where dps is degrees per second). In some embodiments, the sensitivity of MEMS multiple axis sensing device 20 to linear acceleration may be, for example, 400 Hz/G and the sensitivity of MEMS multiple axis sensing device 20 to angular rotation may be, for example, 0.54 Hz/dps, in illustrated the turning fork design. It should be understood, however, that other sensitivity values for linear acceleration and angular rotation may alternatively be achieved.

Signal processing circuit 130 includes a third combining circuit 182 (e.g., a frequency summing circuit) in electrical communication with the outputs of first and second combining circuits 174, 178. Third combining circuit 182 generates a linear acceleration value 184, $A_Y$, as a summation of first and second differential output signals 176, 180 (i.e., $\Delta f_{M1} + \Delta f_{M2}$) that is representative of Y-axis linear acceleration 112. Linear acceleration value 184 may be received at a low-pass filter 186 where the signal is suitably filtered to obtain a linear acceleration output value 188, $A_{T(OUT)}$. Thus, linear acceleration output value 188 is based on frequency modulation and it is common mode due to the summation occurring at third combining circuit 182. Accordingly, a common mode frequency modulated acceleration signal is produced as linear acceleration output value 188.

Signal processing circuit 130 further includes a fourth combining circuit 190 (e.g., a differential frequency circuit) also in electrical communication with the outputs of first and second combining circuits 174, 176. Fourth combining circuit 190 generates an angular rotation rate value 192, $\Omega_{Z(MOD)}$, as the difference between first and second differential output signals 176, 180 (i.e., $\Delta f_{M1} - \Delta f_{M2}$) that is representative of Z-axis angular rotation 114. Angular rotation rate value 192 is modulated by the drive frequency (e.g., 20 kHz) used to place first and second drive masses 32, 36 in antiphase drive motion 122 (FIG. 3). Thus, angular rotation rate value 192 may be received at an amplitude demodulator 194 where the signal is suitably demodulated to obtain a demodulated angular rotation rate value 196, $\Omega_{Z(DE-MOD)}$. Thereafter, demodulated angular rotation rate value 196 may be received at a low-pass filter 198 where the signal is suitably filtered to obtain an angular rotation rate output value 200, $\Omega_{Z(OUT)}$. Thus, angular rotation rate output value 200 is also based on frequency modulation and it is differential mode due to the subtraction occurring at fourth combining circuit 190. Accordingly, a differential mode frequency modulated angular rotation rate signal is produced as angular rotation rate output value 200.

Accordingly, MEMS multiple axis sensing device 20 with signal processing circuit 130 is configured to perform the functions of actuating first and second drive masses 34, 38 to undergo antiphase drive motion 122 (FIG. 3) along a first axis (e.g., X-axis 68) oriented parallel to surface 24 of substrate 22, sensing antiphase sense motion 124 (FIG. 4) of first and second sense masses 36, 40 along a second axis (e.g., Y-axis 70) parallel to surface 24 of substrate 22 and perpendicular to the first axis in response to an angular rotation (e.g., Z-axis angular rotation 114) about a third axis (e.g., Z-axis 72) perpendicular to surface 24 of substrate 22, and sensing in-phase sense motion 126 (FIG. 5) of first and second sense masses 36, 40 along the second axis in response to linear acceleration (e.g., Y-axis linear acceleration 112) along the second axis. Further functions entail determining an angular rotation rate value (e.g., angular rotation rate output value 200) about the third axis in response to the antiphase sense motion and determining a linear acceleration value (e.g., linear acceleration output value) in response to the antiphase sense motion.

A simplified block diagram of signal processing circuit 130 is provided for illustrative purposes. Those skilled in the art will recognize that the particular processing blocks of a signal processing circuit can differ from that shown while still performing the functions of producing a first differential signal from the output signals associated with the first and second resonator beams, producing a second differential signal from the output signals associated with the third and fourth resonator beams, summing the first and second differential signals to generate the linear acceleration value, and determining the difference between the first and second differential signals to generate the angular rotation rate value.

Figure 7:
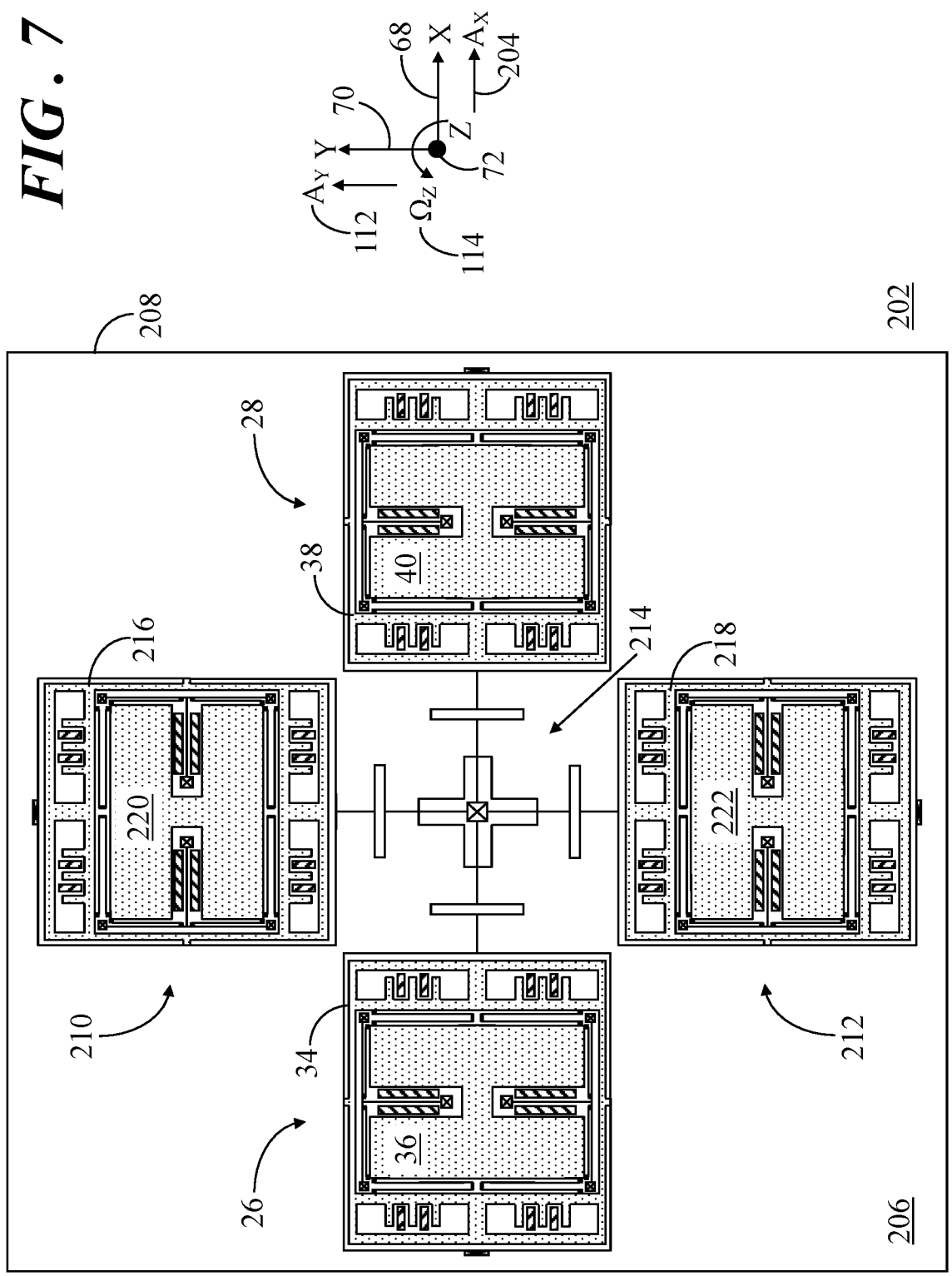
FIG. 7 shows a schematic plan view of a microelectromechanical systems (MEMS) multiple axis sensing device in accordance with another embodiment.

FIG. 7 shows a schematic plan view of a microelectromechanical systems (MEMS) multiple axis sensing device 202 in accordance with another embodiment. MEMS multiple axis sensing device 202 may be configured to sense Y-axis linear acceleration 112, Z-axis angular rotation 114, and an X-axis linear acceleration 204. By way of example, MEMS multiple axis sensing device 202 may include first and second inertial mass systems 26, 28 as discussed in detail above. First and second inertial mass systems 26, 28 are anchored to and spaced apart from a surface 206 of a substrate 208. MEMS device 202 additionally includes third and fourth inertial mass systems 210, 212 anchored to and spaced apart from surface 206 of substrate 208. Third and fourth inertial mass systems 210, 212 include the same components as first and second inertial mass systems 26, 28 and therefore operate in a similar manner as first and second inertial mass systems 26, 28. As such, a detailed description of third and fourth inertial mass systems 206, 208 will not be provided herein for brevity.

Of particular interest in this example, third and fourth inertial mass systems 210, 212 are rotated 90° relative to first and second inertial mass systems 26, 28. Additionally, first, second, third, and fourth inertial mass systems 26, 28, 210, 212 are interconnected by a spring system 214. Spring system 214 is coupled to the underlying surface 206 of substrate 208. Spring system 214 may be any convenient shape, size, and material for enabling antiphase drive motion of first and second drive masses 34, 38 of first and second inertial mass systems along X-axis 68 (e.g., the drive axis) and for enabling antiphase drive motion of third and fourth drive masses 216, 218 of third and fourth inertial mass systems 210, 212 along Y-axis 70. In this manner, and as discussed in detail above, a resonance frequency of the resonator beams associated with third and fourth sense masses 220, 222 of third and fourth inertial mass systems 210, 212 will vary in response to a linear acceleration (e.g., X-axis linear acceleration 204) aligned with X-axis 68 and/or in response to a Coriolis force transferred from third and fourth drive masses 216, 218 to third and fourth sense masses 220, 222 in response to rotation of MEMS device 202 about Z-axis 72.

Embodiments disclosed herein entail a microelectromechanical systems (MEMS) multiple axis sensing device and method of operation. More particularly, the MEMS multiple axis sensing device is based on frequency modulation (FM) for concurrently sensing linear acceleration and angular rate (i.e., velocity) using a single inertial mass detection structure. An FM resonant accelerometer and an FM vibratory gyroscope are co-fabricated as a single detection structure in which detection of the linear acceleration and the angular rate is based on the variation of frequency (e.g., frequency modulation) of one or more elements set in resonance. The linear acceleration can be detected by a common mode FM signal and the angular rate can be detected by a differential mode FM signal. Resonant detection, as compared to other measuring techniques, can yield a direct frequency output, high sensitivity, and wide dynamic range. Further, a single FM-based detection structure enables the same cavity pressure for both accelerometer and gyroscope, which may thereby simplify the MEMS processing technology, reduce MEMS die size, and reduce the quantity of MEMS dies in a sensor package.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A microelectromechanical systems (MEMS) multiple axis sensing device comprising:
    a substrate having a surface;
    a first inertial mass system including a first drive mass and a first sense mass elastically coupled to the first drive mass;
    a second inertial mass system including a second drive mass and a second sense mass elastically coupled to the second drive mass, the first and second drive masses being configured to undergo antiphase drive motion along a first axis oriented parallel to the surface of the substrate;
    first sense springs configured to anchor and suspend the first sense mass spaced apart from the surface of the substrate;
    second sense springs configured to anchor and suspend the second sense mass spaced apart from the surface of the substrate, the first and second sense springs enabling antiphase sense motion of the first and second sense masses along a second axis parallel to the surface of the substrate and perpendicular to the first axis in response to an angular rotation about a third axis perpendicular to the surface of the substrate, and the first and second sense springs further enabling in-phase sense motion of the first and second sense masses along the second axis in response to a linear acceleration along the second axis, a first resonator beam elastically coupled to the first sense mass through one of the first sense springs, the first resonator beam being configured to undergo a first axial stress in response to movement of the first sense mass along the second axis;

a second resonator beam elastically coupled to the first sense mass through another one of the first sense springs, the second resonator beam being configured to undergo a second axial stress in response to the movement of the first sense mass along the second axis;

a third resonator beam elastically coupled to the second sense mass through one of the second sense springs, the third resonator beam being configured to undergo a third axial stress in response to movement of the second sense mass along the second axis; and a fourth resonator beam elastically coupled to the second sense mass through another one of the second sense springs, the fourth resonator beam being configured to undergo a fourth axial stress in response to the movement of the second sense mass along the second axis.

2. The MEMS device of claim 1 wherein:
the first drive mass includes a first frame surrounding the first sense mass;
the second drive mass includes a second frame surrounding the second sense mass; and
the MEMS device further comprises:
 first drive springs configured to anchor and suspend the first frame spaced apart from the surface of the substrate; and
 second drive springs configured to anchor and suspend the second frame spaced apart from the surface of the substrate, the first and second drive springs flexibly interconnecting the first and second drive masses.

3. The MEMS device of claim 2 further comprising:
third sense springs coupled to the first frame and to the first drive springs of the first drive mass; and
fourth sense springs coupled to the second frame and to the second drive springs of the second drive mass, each of the third and fourth sense springs having a longitudinal extension parallel to the first axis, the longitudinal extension being configured to deform in response to the in-phase or antiphase sense motion of the first and second inertial masses.

4. The MEMS device of claim 2 wherein each of the first and second drive springs has a longitudinal extension parallel to the second axis, the longitudinal extension being configured to deform to enable the antiphase drive motion of the first and second inertial masses along the first axis.

5. The MEMS device of claim 2 further comprising:
third drive springs interposed between and interconnecting the first sense mass and the first frame of the first drive mass; and
fourth drive springs interposed between and interconnecting the second sense mass and the second frame of the second drive mass, wherein the third and fourth drive springs are configured to deform to prevent transmission of the antiphase drive motion from the first and second drive masses to the first and second sense masses.

6. The MEMS device of claim 1 further comprising:
a first drive electrode and a first sense electrode aligned with the first resonator beam, the first drive electrode being configured to resonate the first resonator beam and the first sense electrode being configured to detect variations of a resonance frequency of the first resonator beam in response to the first axial stress;

a second drive electrode and a second sense electrode aligned with the second resonator beam, the first drive electrode being configured to resonate the second resonator beam and the second sense electrode being configured to detect variations of the resonance frequency of the second resonator beam in response to the second axial stress;

a third drive electrode and a third sense electrode aligned with the third resonant element, the third drive electrode being configured to resonate the third resonator beam and the third sense electrode being configured to detect variations of the resonance frequency of the third resonator beam in response to the third axial stress; and a fourth drive electrode and a fourth sense electrode aligned with the fourth resonant element, the fourth drive electrode being configured to resonate the fourth resonator beam and the fourth sense electrode being configured to detect variations of the resonance frequency of the fourth resonator beam in response to the fourth axial stress.

7. The MEMS device of claim 6 wherein:
the first sense electrode is configured to provide a first output signal corresponding to the first axial stress;
the second sense electrode is configured to provide a second output signal corresponding to the second axial stress;
the third sense electrode is configured to provide a third output signal corresponding to the third axial stress;
the fourth sense electrode is configured to provide a fourth output signal corresponding to the fourth axial stress; and
the MEMS device further comprises a signal processing circuit configured to receive the first, second, third, and fourth output signals, the signal processing circuit being further configured to generate a linear acceleration value and/or an angular rotation rate value in response to the first, second, third, and fourth output signals.

8. The MEMS device of claim 7 wherein the signal processing circuit is configured to produce a common mode frequency modulated (FM) acceleration signal as the linear acceleration value and to produce a differential mode FM rotation rate signal as the angular rotation rate value.

9. The MEMS device of claim 7 wherein the signal processing circuit is configured to produce a first differential signal as a difference between the first and second output signals, produce a second differential signal as a difference between the third and fourth output signals, sum the first and second differential signals to generate the linear acceleration value, and determine a difference between the first and second differential signals to generate the angular rotation rate value.

10. A method comprising:
providing a microelectromechanical systems (MEMS) multiple axis sensing device including a substrate having a surface, a first inertial mass system including a first drive mass and a first sense mass elastically coupled to the first drive mass, a second inertial mass system including a second drive mass and a second sense mass elastically coupled to the second drive mass, first sense springs configured to anchor and suspend the first sense mass spaced apart from the surface of the substrate, and second sense springs configured to anchor and suspend the second sense mass spaced apart from the surface of the substrate;

actuating the first and second drive masses to undergo antiphase drive motion along a first axis oriented parallel to the surface of the substrate;

actuating a first resonator beam to resonate, the first resonator beam being elastically coupled to the first sense mass through one of the first sense springs;

actuating a second resonator beam to resonate, the second resonator beam being elastically coupled to the first sense mass through another one of the first sense springs;

actuating a third resonator beam to resonate, the third resonator beam being elastically coupled to the second sense mass through one of the second sense springs;

actuating a fourth resonator beam to resonate, the fourth resonator beam being elastically coupled to the second sense mass through another one of the sense springs;

sensing antiphase sense motion of the first and second sense masses along a second axis parallel to the surface of the substrate and perpendicular to the first axis in response to an angular rotation about a third axis perpendicular to the surface of the substrate, wherein the first and second sense springs enable the antiphase sense motion;

sensing in-phase sense motion of the first and second sense masses along the second axis in response to a linear acceleration along the second axis, wherein the first and second sense springs further enable the in-phase sense motion, and wherein the sensing the in-phase sense motion and the sensing the antiphase sense motion comprises:
  detecting variations of a resonance frequency of the first resonator beam in response to a first axial stress, the first resonator beam being configured to undergo the first axial stress in response to movement of the first sense mass along the second axis;
  detecting variations of the resonance frequency of the second resonator beam in response to a second axial stress, the second resonator beam being configured to undergo the second axial stress in response to the movement of the first sense mass along the second axis;
  detecting variations of the resonance frequency of the third resonator beam in response to a third axial stress, the second resonator beam being configured to undergo the third axial stress in response to movement of the second sense mass along the second axis; and
  detecting variations of the resonance frequency of the fourth resonator beam in response to a fourth axial stress, the fourth resonator beam being configured to undergo the fourth axial stress in response to the movement of the second sense mass along the second axis;

determining an angular rotation rate value of the angular rotation about the third axis in response to the antiphase sense motion; and determining a linear acceleration value of the linear acceleration along the second axis in response to the in-phase sense motion.

11. The method of claim 10 further comprising preventing transmission of the antiphase drive motion from the first and second drive masses to the first and second sense masses.

12. The method of claim 10 wherein the determining the angular rotation rate value comprises:
  receiving, at a signal processing circuit, first, second, third, and fourth output signals, wherein the first output signal corresponds to the first axial stress, the second output signal corresponds to the second axial stress, the third output signal corresponds to the third axial stress, and the fourth output signal corresponds to the fourth axial stress;
  producing, at the signal processing circuit, a first differential signal as a difference between the first and second output signals;
  producing, at the signal processing circuit, a second differential signal as a difference between the third and fourth output signals; and
  calculating, at the signal processing circuit, a difference between the first and second differential signals to generate the angular rotation rate signal, wherein the angular rotation rate signal is a differential mode frequency modulated (FM) rotation rate signal.

13. The method of claim 10 wherein the determining the linear acceleration value comprises:
  receiving, at a signal processing circuit, first, second, third, and fourth output signals, wherein the first output signal corresponds to the first axial stress, the second output signal corresponds to the second axial stress, the third output signal corresponds to the third axial stress, and the fourth output signal corresponds to the fourth axial stress;
  producing, at the signal processing circuit, a first differential signal as a difference between the first and second output signals;
  producing, at the signal processing circuit, a second differential signal as a difference between the third and fourth output signals; and
  summing, at the signal processing circuit, the first and second differential signals to generate the linear acceleration value, wherein the linear acceleration value is a common mode frequency modulated (FM) acceleration signal.

14. A microelectromechanical systems (MEMS) multiple axis sensing device comprising:
  a substrate having a surface;
  a first inertial mass system including a first drive mass and a first sense mass elastically coupled to the first drive mass;
  a second inertial mass system including a second drive mass and a second sense mass elastically coupled to the second drive mass, the first and second drive masses being configured to undergo antiphase drive motion along a first axis oriented parallel to the surface of the substrate;
  first sense springs configured to anchor and suspend the first sense mass spaced apart from the surface of the substrate;
  second sense springs configured to anchor and suspend the second sense mass spaced apart from the surface of the substrate, the first and second sense springs enabling antiphase sense motion of the first and second sense masses along a second axis parallel to the surface of the substrate and perpendicular to the first axis in response to an angular rotation about a third axis perpendicular to the surface of the substrate, and the first and second sense springs further enabling in-phase sense motion of the first and second sense masses along the second axis in response to a linear acceleration along the second axis;
  a first resonator beam elastically coupled to the first sense mass through one of the first sense springs, the first resonator beam being configured to undergo a first axial stress in response to movement of the first sense mass along the second axis;

a second resonator beam elastically coupled to the first sense mass through another one of the first sense springs, the second resonator beam being configured to undergo a second axial stress in response to the movement of the first sense mass along the second axis;

a third resonator beam elastically coupled to the second sense mass through one of the second sense springs, the third resonator beam being configured to undergo a third axial stress in response to movement of the second sense mass along the second axis; and a fourth resonator beam elastically coupled to the second sense mass through another one of the second sense springs, the fourth resonator beam being configured to undergo a fourth axial stress in response to the movement of the second sense mass along the second axis, wherein the substrate, the first and second inertial mass systems, the first and second sense springs, and the first, second, third, and fourth resonator beams are collocated in a cavity of a packaged device, the cavity being at vacuum.

15. The MEMS device of claim 14 wherein:

the first drive mass includes a first frame surrounding the first sense mass;

the second drive mass includes a second frame surrounding the second sense mass; and the MEMS device further comprises:

first drive springs configured to anchor and suspend the first frame spaced apart from the surface of the substrate; and second drive springs configured to anchor and suspend the second frame spaced apart from the surface of the substrate, the first and second drive springs flexibly interconnecting the first and second drive masses.

16. The MEMS device of claim 15 further comprising:

third drive springs interposed between and interconnecting the first sense mass and the first frame of the first drive mass; and fourth drive springs interposed between and interconnecting the second sense mass and the second frame of the second drive mass, wherein the third and fourth drive springs are configured to deform to prevent transmission of the antiphase drive motion from the first and second drive masses to the first and second sense masses.

17. The MEMS device of claim 14 further comprising:

a first drive electrode and a first sense electrode aligned with the first resonator beam, the first drive electrode being configured to resonate the first resonator beam and the first sense electrode being configured to detect variations of a resonance frequency of the first resonator beam in response to the first axial stress;

a second drive electrode and a second sense electrode aligned with the second resonator beam, the first drive electrode being configured to resonate the second resonator beam and the second sense electrode being configured to detect variations of the resonance frequency of the second resonator beam in response to the second axial stress;

a third drive electrode and a third sense electrode aligned with the third resonant element, the third drive electrode being configured to resonate the third resonator beam and the third sense electrode being configured to detect variations of the resonance frequency of the third resonator beam in response to the third axial stress; and a fourth drive electrode and a fourth sense electrode aligned with the fourth resonant element, the fourth drive electrode being configured to resonate the fourth resonator beam and the fourth sense electrode being configured to detect variations of the resonance frequency of the fourth resonator beam in response to the fourth axial stress.

* * * * *